(12) United States Patent
Baik

(10) Patent No.: US 12,740,465 B2
(45) Date of Patent: Sep. 15, 2026

(54) SEMICONDUCTOR PACKAGE

(71) Applicant: Samsung Electronics Co., Ltd., Suwon-si (KR)

(72) Inventor: Seunghyun Baik, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 385 days.

(21) Appl. No.: 18/437,895

(22) Filed: Feb. 9, 2024

(65) Prior Publication Data

US 2024/0395755 A1 Nov. 28, 2024

(30) Foreign Application Priority Data

May 24, 2023 (KR) ........................ 10-2023-0067264
Aug. 25, 2023 (KR) ........................ 10-2023-0111965

(51) Int. Cl.

| | |
|---|---|
| ***H10W 72/20*** | (2026.01) |
| ***H10W 72/00*** | (2026.01) |
| ***H10W 72/30*** | (2026.01) |
| ***H10W 74/00*** | (2026.01) |
| ***H10W 74/15*** | (2026.01) |
| ***H10W 90/00*** | (2026.01) |

(52) U.S. Cl.
CPC ........... *H10W 72/20* (2026.01); *H10W 72/30* (2026.01); *H10W 72/851* (2026.01); *H10W 72/07254* (2026.01); *H10W 72/227* (2026.01); *H10W 72/244* (2026.01); *H10W 72/247* (2026.01); *H10W 74/00* (2026.01); *H10W 74/15* (2026.01); *H10W 90/724* (2026.01); *H10W 90/734* (2026.01)

(58) Field of Classification Search
None
See application file for complete search history.

(56) References Cited

U.S. PATENT DOCUMENTS

| | | | | |
|---|---|---|---|---|
| 10,096,540 | B2 * | 10/2018 | Lee | H10W 90/701 |
| 10,276,548 | B2 * | 4/2019 | Chen | H10W 70/09 |
| 11,101,145 | B2 * | 8/2021 | Tsai | H10W 74/012 |
| 11,437,334 | B2 * | 9/2022 | Huang | H10W 70/65 |
| 2008/0258288 | A1 | 10/2008 | Park et al. | |

(Continued)

FOREIGN PATENT DOCUMENTS

| | | | |
|---|---|---|---|
| CN | 107403764 | A | 11/2017 |
| KR | 20080094203 | A | 10/2008 |
| KR | 100885918 | B1 | 2/2009 |

*Primary Examiner* — Alexander G Ghyka
(74) *Attorney, Agent, or Firm* — Wolf, Greenfield & Sacks, P.C.

(57) ABSTRACT

Some embodiments of the present disclosure provide a semiconductor package including: a package substrate including a main pad and a main wiring pattern; a semiconductor chip on the package substrate; a plurality of connection bumps between the package substrate and the semiconductor chip and including a plurality of connection solder patterns on the main pad and a plurality of connection pillars on the connection solder patterns; a dummy insulating pattern between the package substrate and the semiconductor chip and configured to cover the main wiring pattern; and a plurality of dummy pillars on the dummy insulating pattern, wherein the dummy pillars are in contact with the dummy insulating pattern, and are electrically insulated from the dummy insulating pattern.

20 Claims, 15 Drawing Sheets

(56) References Cited

U.S. PATENT DOCUMENTS

| | | | | |
|---|---|---|---|---|
| 2012/0286418 | A1* | 11/2012 | Lee | H10W 90/701 257/737 |
| 2018/0076184 | A1* | 3/2018 | Chen | H10W 70/09 |
| 2020/0058519 | A1* | 2/2020 | Tsai | H10W 74/012 |
| 2021/0066230 | A1* | 3/2021 | Huang | H10W 70/65 |
| 2022/0352109 | A1* | 11/2022 | Yu | H10W 90/00 |
| 2023/0021376 | A1* | 1/2023 | Lee | H10B 12/50 |

* cited by examiner

SEMICONDUCTOR PACKAGE

CROSS-REFERENCE TO RELATED APPLICATION

This application claims priority to and the benefit of Korean Patent Application No. 10-2023-0067264, filed in the Korean Intellectual Property Office on May 24, 2023, and Korean Patent Application No. 10-2023-0111965, filed in the Korean Intellectual Property Office on Aug. 25, 2023, the entire contents of which are incorporated herein by reference.

BACKGROUND

The present disclosure relates to a semiconductor package.

The semiconductor industry seeks to increase integration density so that more passive or active devices can be integrated within a given area. Further, as technology development for miniaturizing a circuit line width of a semiconductor front-end process gradually faces limitations, the semiconductor industry is making semiconductor packages that protect semiconductor chips with integrated circuits lighter, thinner, smaller, faster, and more functional, and there is a trend to complement the limitations of the semiconductor front-end process by developing the semiconductor packages with high integration density.

Meanwhile, semiconductor devices may generally have electrical connection terminals such as solder balls or bumps to be electrically connected to other electronic devices or printed circuit boards. There is a demand for connection terminals of semiconductor devices to have a finer pitch.

SUMMARY

According to some embodiments, reliability of a semiconductor package may be improved by improving fluidity of an underfill film in a dummy area.

Some embodiments of the present disclosure provide a semiconductor package including: a package substrate including a main pad and a main wiring pattern; a semiconductor chip on the package substrate; a plurality of connection bumps between the package substrate and the semiconductor chip and including a plurality of connection solder patterns on the main pad and a plurality of connection pillars on the connection solder patterns; a dummy insulating pattern between the package substrate and the semiconductor chip and configured to cover the main wiring pattern; and a plurality of dummy pillars on the dummy insulating pattern, wherein the dummy pillars are in contact with the dummy insulating pattern, and are electrically insulated from the dummy insulating pattern.

Some embodiments of the present disclosure provide a semiconductor package including: a package substrate; a semiconductor chip on the package substrate; a plurality of connection bumps between the package substrate and the semiconductor chip, each including a connection solder pattern and a connection pillar on the connection solder pattern; a dummy insulating pattern between the package substrate and the semiconductor chip and positioned between the connection bumps; and a plurality of dummy pillars on the dummy insulating pattern, wherein the dummy pillars are in contact with the dummy insulating pattern, and are electrically insulated from the dummy insulating pattern.

Some embodiments of the present disclosure provide a semiconductor package including: a package substrate including a main pad and a main wiring pattern; a semiconductor chip on the package substrate and including a chip pad; a plurality of connection bumps between the package substrate and the semiconductor chip; a dummy insulating pattern between the package substrate and the semiconductor chip and configured to cover the main wiring pattern; and a plurality of dummy pillars on the dummy insulating pattern, wherein the plurality of connection bumps include: a plurality of connection solder patterns on the main pad; and a plurality of connection pillars on the connection solder patterns and connected to the chip pad, and a thickness of the dummy pillars is the same as a thickness of the connection pillars.

According to some embodiments, the semiconductor package may include a plurality of dummy pillars in a dummy area, thereby improving fluidity of the underfill film in the dummy area, which results in improving reliability of the semiconductor package.

BRIEF DESCRIPTION OF THE DRAWINGS

FIG. 1 illustrates a top plan view showing a semiconductor package according to some embodiments.

FIG. 3 illustrates an enlarged cross-sectional view of a region S1 of FIG. 2.

FIG. 7 and FIG. 8 illustrate cross-sectional views showing semiconductor packages according to some embodiments.

FIG. 9 to FIG. 15 illustrate cross-sectional views showing an intermediate step in a manufacturing method for a semiconductor package according to some embodiments.

DETAILED DESCRIPTION

Figure 2:
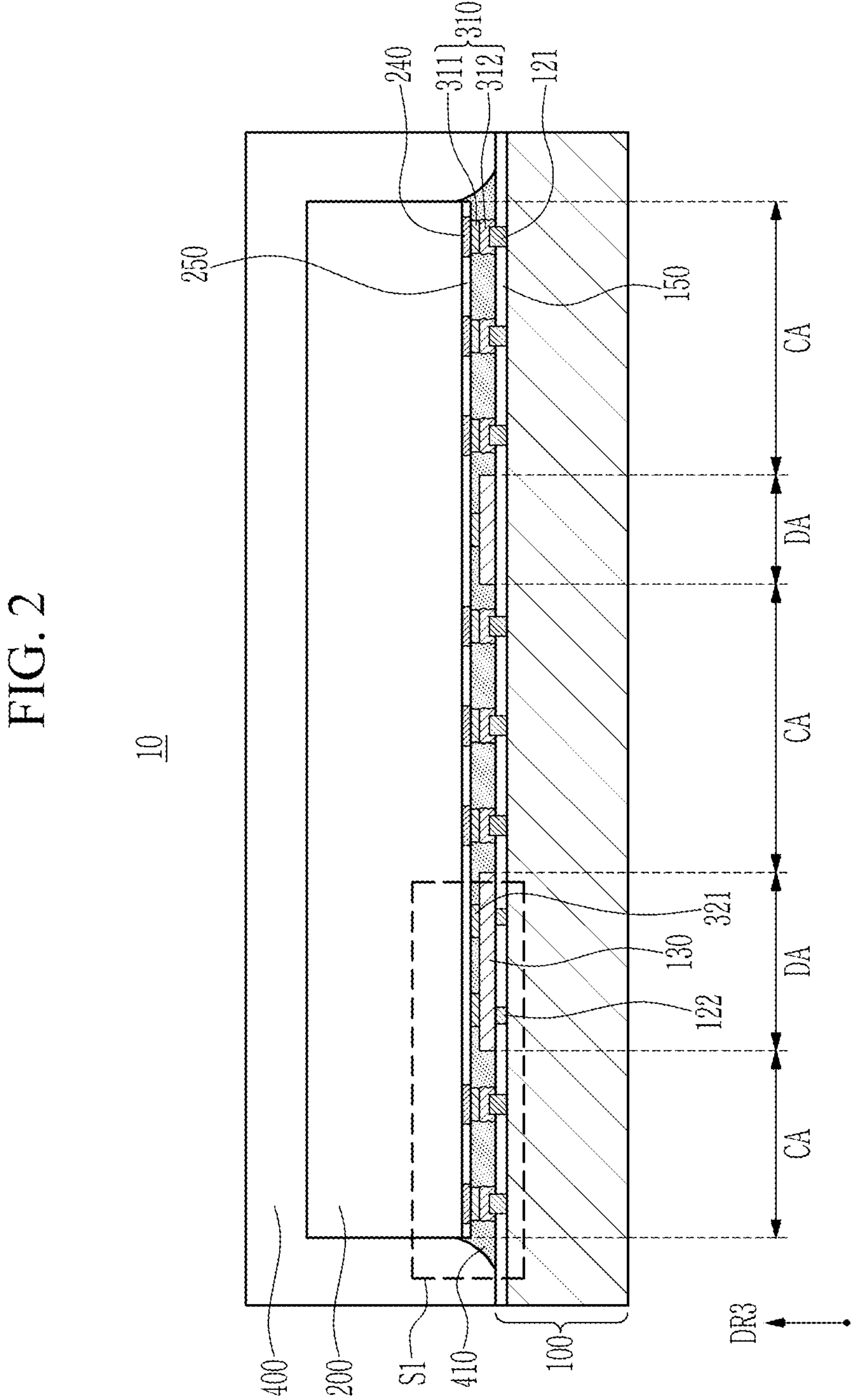
FIG. 2 illustrates a cross-sectional view showing a semiconductor package according to some embodiments.

The present disclosure will be described more fully hereinafter with reference to the accompanying drawings, in which embodiments of the present disclosure are shown. As those skilled in the art would realize, the described embodiments may be modified in various different ways, all without departing from the spirit or scope of the present disclosure.

The drawings and description are to be regarded as illustrative in nature and not restrictive. Like reference numerals designate like elements throughout the specification.

Further, since sizes and thicknesses of constituent members shown in the accompanying drawings may be arbitrarily given for better understanding and ease of description, the present disclosure is not limited to the illustrated sizes and thicknesses.

Throughout this specification and the claims that follow, when it is described that an element is “coupled/connected” to another element, the element may be “directly coupled/connected” to the other element or “indirectly coupled/connected” to the other element through a third element. In addition, unless explicitly described to the contrary, the word “comprise” and variations such as “comprises” or “comprising” will be understood to imply the inclusion of stated elements but not the exclusion of any other elements.

It will be understood that when an element such as a layer, film, region, or substrate is referred to as being “on” another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

Further, throughout the specification, the phrase "in a plan view" means when an object portion is viewed from above, and the phrase "in a cross-sectional view" means when a cross-section taken by vertically cutting an object portion is viewed from the side.

Figure 1:
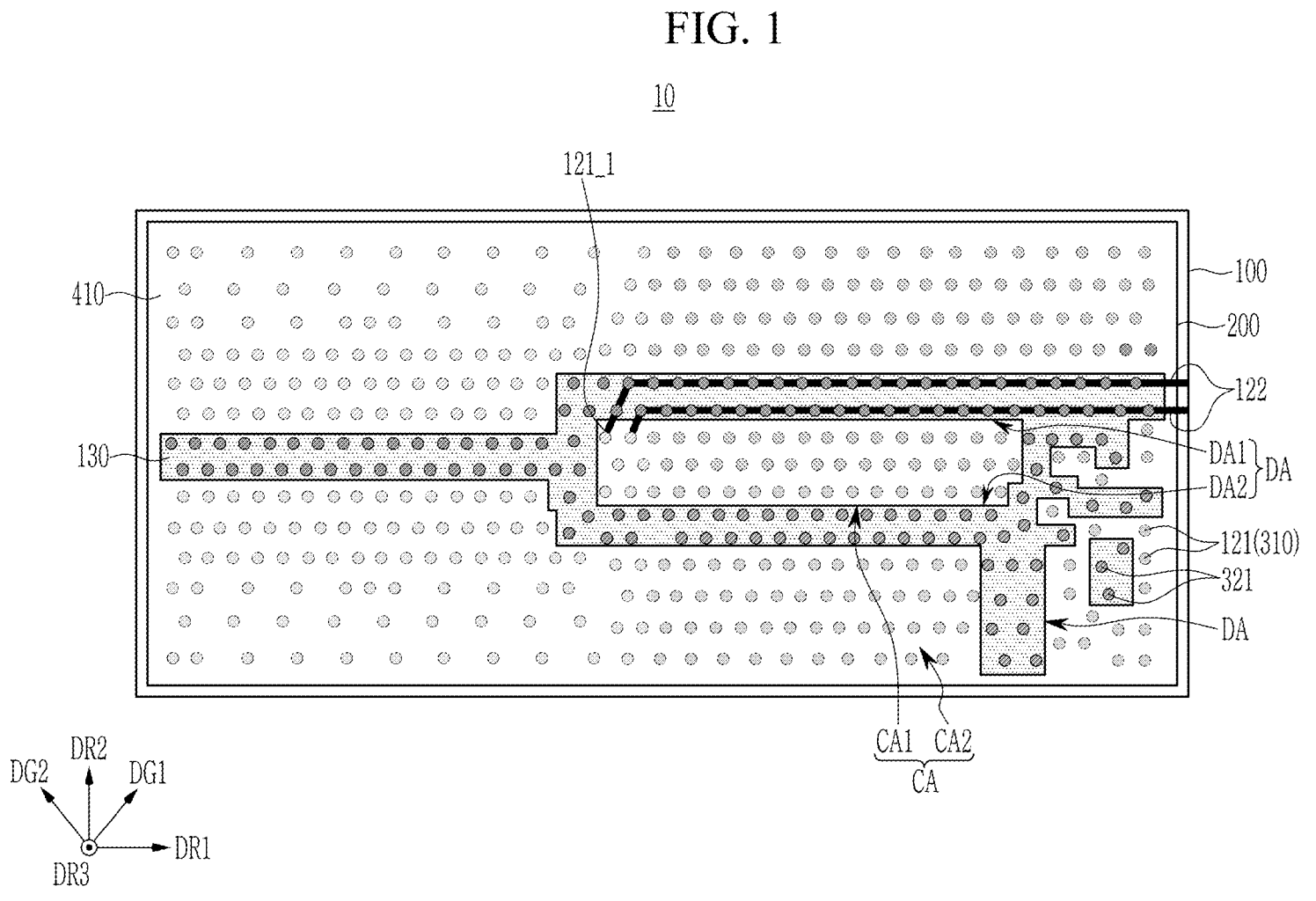

Hereinafter, a semiconductor package according to some embodiments will be described with reference to FIG. 1 to FIG. 5.

Figure 3:
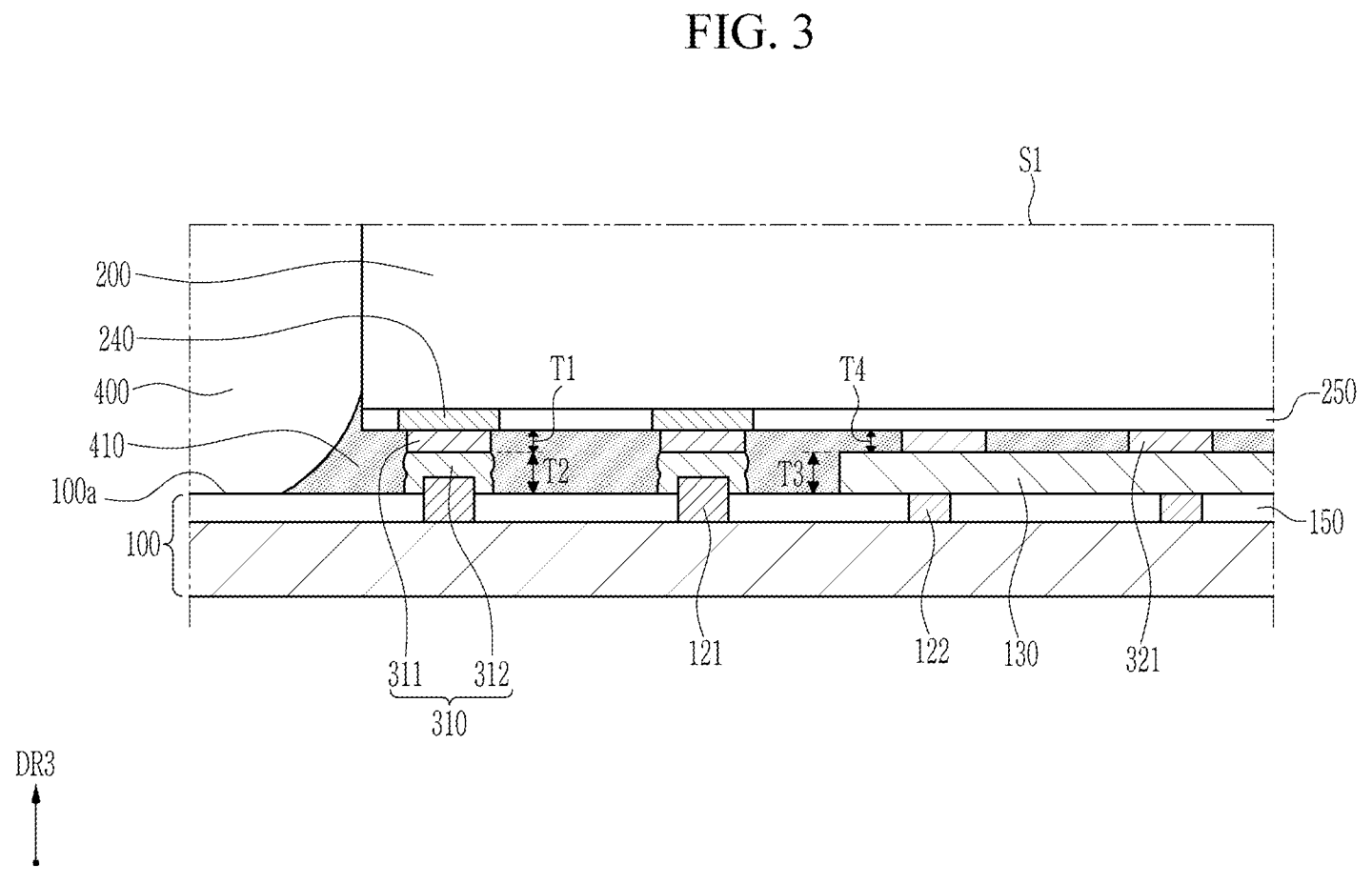
Figure 4:
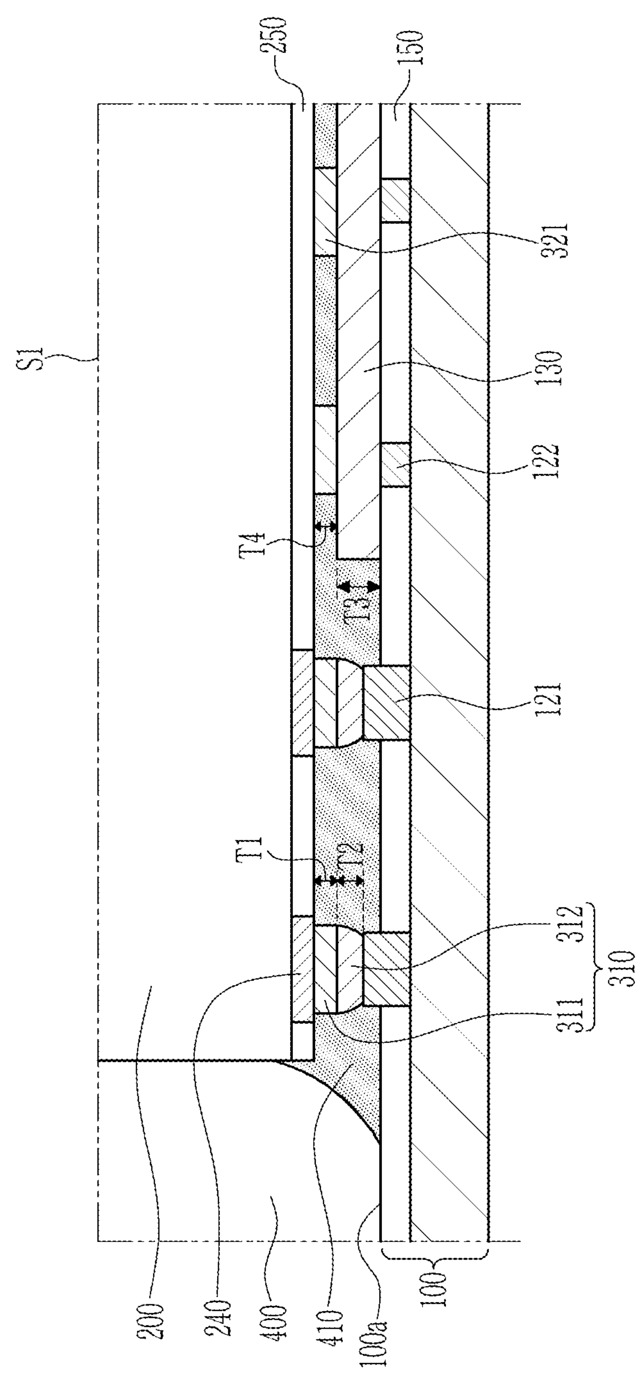
FIG. 4 illustrates a cross-sectional view corresponding to the region S1 in FIG. 2 showing the semiconductor package according to some embodiments.
Figure 5:
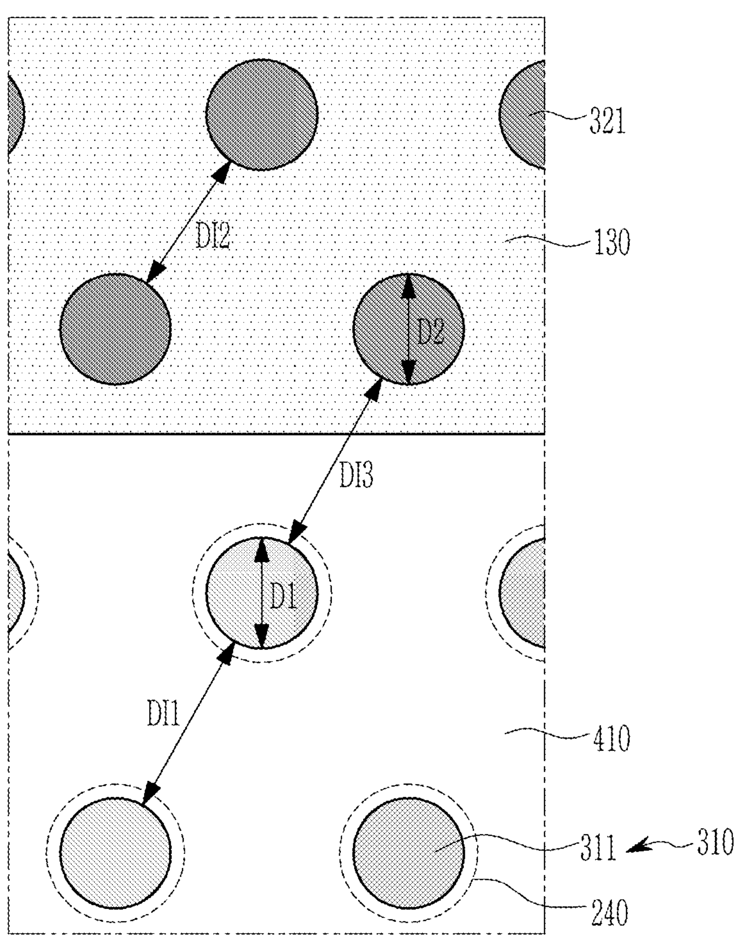
FIG. 5 and FIG. 6 each illustrate a top plan view showing a partial area of a semiconductor package according to some embodiments.
Figure 5:
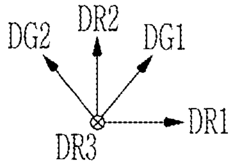

FIG. 1 illustrates a top plan view showing a semiconductor package according to some embodiments. FIG. 2 illustrates a cross-sectional view showing a semiconductor package according to some embodiments. FIG. 3 illustrates an enlarged cross-sectional view of a region S1 of FIG. 2. FIG. 4 illustrates a cross-sectional view corresponding to the region S1 in FIG. 2 showing the semiconductor package according to some embodiments. FIG. 5 illustrates a top plan view showing a partial area of a semiconductor package according to some embodiments.

First, referring to FIG. 1 to FIG. 3, a semiconductor package 10 according to some embodiments may include a package substrate 100, a semiconductor chip 200, a plurality of connection bumps 310, a dummy insulating pattern 130, and a plurality of dummy pillars 321.

The package substrate 100 may be a substrate for package, e.g., a printed circuit board (PCB) or a ceramic substrate. If the package substrate 100 is a printed circuit board, the package substrate 100 may be made of at least one material selected from a phenol resin, an epoxy resin, and polyimide.

The package substrate 100 may have an upper surface 100*a* and a lower surface facing or opposite each other. The package substrate 100 may include integrated circuits. A semiconductor chip 200 may be mounted on the upper surface 100*a* of the package substrate 100. The package substrate 100 may be electrically connected to the semiconductor chip 200.

The package substrate 100 according to some embodiments may include a main pad insulating layer 150, a plurality of main pads 121, and a main wiring pattern 122.

In some embodiments, as illustrated in FIG. 1, the package substrate 100 may include a contact area CA and a dummy area DA. The contact area CA may include an area where the main pads 121 are positioned on the upper surface 100*a* of the package substrate 100. That is, if the semiconductor chip 200 is mounted on the package substrate 100, the contact area CA may be an area where the main pads 121 of the package substrate 100 and the semiconductor chip 200 are connected.

The dummy area DA may be positioned between contact areas CA. For example, as shown in FIG. 1, the dummy area DA may be positioned between a first contact area CA1 and a second contact area CA2 in a plan view. Additionally, the dummy area DA may surround a portion of the contact area CA. For example, the dummy area DA may surround the first contact area CA1 in a plan view, but the present disclosure is not limited thereto.

The dummy area DA may include an area where the main wiring pattern 122 is positioned on the upper surface 100*a* of the package substrate 100. Additionally, the dummy area DA may include an empty space positioned between the main pads 121. For example, as illustrated in FIG. 1, the dummy area DA may include the first dummy area DA1 where the main wiring pattern 122 is positioned and the second dummy area DA2 between the main pads 121. That is, if the semiconductor chip 200 is mounted on the package substrate 100, the dummy area DA may be an area where the main pads 121 of the package substrate 100 and the semiconductor chip 200 are not connected. A description thereof will be provided below in the description of the dummy insulating pattern 130 and the dummy pillars 321.

The main pad insulating layer 150 may be positioned at an upper portion of the package substrate 100. The main pad insulating layer 150 may prevent the main pads 121 and the main wiring pattern 122 from being short-circuited. The main pad insulating layer 150 may include at least one of a silicon-based insulating material such as a silicon oxide or a silicon nitride, a polymer such as PBO, BCB or polyimide, and a nitride such as PSG or BPSG.

The main pads 121 may be positioned in the contact area CA. The main pads 121 may be arranged to be spaced apart from each other in the contact area CA. For example, as illustrated in FIG. 1, some of the main pads 121 may be arranged to be spaced apart along a first diagonal direction DG1 that intersects a first direction DR1 and a second direction DR2. Additionally, some of the main pads 121 may be arranged to be spaced apart along the first direction DR1, the second direction DR2, and a second diagonal direction DG2 that intersects the first diagonal direction DG1. As an example, the main pads 121 positioned in the first contact area CA surrounded by the dummy area DA may be arranged to be spaced apart along the first diagonal direction DG1 and the second diagonal direction DG2. In this case, the main pads 121 positioned in the first contact area CA surrounded by the dummy area DA may be arranged spaced apart at predetermined intervals along the first diagonal direction DG1 and the second diagonal direction DG2. Additionally, some of the main pads 121 may be arranged in the first direction DR1 and/or the second direction DR2.

In some embodiments, the main pads 121 may extend through the main pad insulating layer 150, and may protrude from or extend from the upper surface 100*a* of the package substrate 100. That is, a portion of a side surface of the main pads 121 may be surrounded by the main pad insulating layer 150. However, the present disclosure is not limited thereto, and the main pads 121 may extend through at least a portion of the main pad insulating layer 150. A protruding portion of the main pads 121 may be connected to the connection bumps 310, which will be described below.

In some embodiments, at least some of the main pads 121 may be power pins or ground pins to which a power voltage and/or a ground voltage are applied, respectively. For example, a first main pad 121_1 may be a power pin connected to the main wiring pattern 122 to which a power voltage is applied. Additionally, the main pads 121 may be electrically connected to internal wires and/or internal vias in the package substrate 100. Herein, being electrically connected to a component includes direct connection or indirect connection through another conductive component.

The main pads 121 may include a conductive material. For example, the main pads 121 may include at least one of copper (Cu), nickel (Ni), chromium (Cr), aluminum (Al), silver (Ag), gold (Au), or iron (Fe).

The main wiring pattern 122 may be positioned in the dummy area DA. The main wiring pattern 122 may be buried in the upper surface 100*a* of the package substrate 100 in the dummy area DA. The main wiring pattern 122 may extend in a direction from the dummy area DA. For example, as illustrated FIG. 1, the main wiring pattern 122 may extend along the first direction DR1 to a side surface of the package substrate 100.

In some embodiments, the main wiring pattern 122 may extend through the main pad insulating layer 150. An upper surface of the main wiring pattern 122 may be aligned with the upper surface 100*a* of the package substrate 100. That is, the upper surface of the main wiring pattern 122 may be positioned at substantially a same level as or coplanar with the upper surface 100*a* of the package substrate 100. Accordingly, an upper surface of the main pads 121 may protrude from the upper surface of the main wiring pattern 122 (e.g., an upper surface of the main pads 121 may be at a higher vertical level than the upper surface of the main wiring pattern 122).

The main wiring pattern 122 may be a wiring for applying a power voltage and/or a ground voltage from an outside. That is, the main wiring pattern 122 may be electrically connected to the first main pad 121_1 to apply a voltage applied from the outside to the first main pad 121_1. Accordingly, a voltage may be applied to the semiconductor chip 200 through the first main pad 121_1 connected to the main wiring pattern 122.

The semiconductor chip 200 may be mounted on the package substrate 100 according to some embodiments.

The semiconductor chip 200 may include a three-dimensional integrated circuit (3D IC) structure. Additionally, in some embodiments, the semiconductor chip 200 may include a system on chip (SOC). For example, the semiconductor chip 200 may include at least one of a central processing unit (CPU), a graphics processing unit (GPU), a memory, a controller, a codec, a sensor, a communication chip, or any combination thereof. However, the present disclosure is not limited thereto, and the semiconductor chip 200 may include a single chip such as a DRAM or multiple chips such as a high bandwidth memory (HBM).

The semiconductor chip 200 of the semiconductor package 10 according to some embodiments may include a chip pad insulating layer 250 and a plurality of chip pads 240.

The chip pad insulating layer 250 may be positioned below the semiconductor chip 200. The chip pad insulating layer 250 may prevent the chip pads 240 from being short-circuited with each other. The chip pad insulating layer 250 may include at least one of a silicon-based insulating material such as a silicon oxide or a silicon nitride, a polymer such as PBO, BCB or polyimide, and a nitride such as PSG or BPSG.

The chip pads 240 may be provided at a lower portion of the semiconductor chip 200. The chip pads 240 may be embedded in the lower surface of the semiconductor chip 200. The chip pads 240 may be electrically connected to integrated circuits through interconnection structures within the semiconductor chip 200. The chip pads 240 may be positioned to be spaced apart from each other.

In some embodiments, the chip pads 240 may be physically and electrically connected to a plurality of connection pillars 311. The chip pads 240 may overlap the connection pillars 311 in a third direction DR3. Additionally, the chip pads 240 may not overlap a plurality of dummy pillars 321 in the third direction DR3. The chip pads 240 may include a conductive material. For example, the chip pads 240 may include at least one of copper (Cu), nickel (Ni), chromium (Cr), aluminum (Al), silver (Ag), gold (Au), or iron (Fe).

In some embodiments, the semiconductor chip 200 may further include a semiconductor substrate, integrated circuits, and a wiring layer. The integrated circuits and the wiring layer may be electrically connected to the chip pads 240. Accordingly, signals transmitted to the chip pads 240 may be applied to integrated circuits through the wiring layer, and the integrated circuits may operate according to the applied signals.

According to some embodiments, the connection bumps 310, the dummy insulating pattern 130, the dummy pillars 321, an underfill film 410, and a molding film 400 may be included between the semiconductor chip 200 and the package substrate 100.

The connection bumps 310 may be positioned in the contact area CA. The connection bumps 310 may be provided between the semiconductor chip 200 and the package substrate 100 in the contact area CA. That is, the connection bumps 310 may be positioned between the main pads 121 and the chip pads 240 to be electrically connected to the main pads 121 and the chip pads 240. Each of the connection bumps 310 may overlap the main pads 121 in the third direction DR3. Accordingly, the semiconductor chip 200 may be electrically connected to the package substrate 100 through the connection bumps 310.

Referring further to FIG. 5, in the contact area CA, the connection bumps 310 may be arranged to be spaced apart from each other. For example, as illustrated in FIG. 5, the connection bumps 310 may be arranged to be spaced apart along the first diagonal direction DG1 and the second diagonal direction DG2. In this case, the connection bumps 310 may be arranged to be spaced apart at a predetermined distance along the first diagonal direction DG1 and the second diagonal direction DG2. For example, the connection bumps 310 that are closest to each other in the first diagonal direction DG1 may be arranged to be spaced apart by a first distance DI1. Herein, the first distance DI1 may be a minimum distance between the connection bumps 310 adjacent to each other in the first diagonal direction DG1.

In some embodiments, the first distance DI1 between the connection bumps 310 closest to each other in the first diagonal direction DG1 may be substantially equal to a distance between the connection bumps 310 closest to each other in the second diagonal direction DG2, but the present disclosure is not limited thereto.

In addition, in the drawing, the connection bumps 310 are illustrated as being arranged to be spaced apart along the first diagonal direction DG1 and the second diagonal direction DG2, but the present disclosure is limited thereto, and the connection bumps 310 may be arranged in the first direction DR1 and/or the second direction DR2.

Each of the connection bumps 310 may include a connection pillar 311 and a connection solder pattern 312. Hereinafter, for better comprehension and ease of description, a single chip pad 240, a single main pad 121, a single connection pillar 311, and a single connection solder pattern 312 will be described.

The connection pillar 311 may be provided below a lower surface of the chip pad 240. The connection pillar 311 may overlap the chip pad 240 in the third direction DR3. The connection pillar 311 may be positioned between the chip pad 240 and the connection solder pattern 312. The connection pillar 311 may be electrically connected to the chip pad 240 and the connection solder pattern 312.

The connection pillar 311 may have a circular cylinder shape. For example, the connection pillar 311 may have a circular shape in a plan view, as illustrated in FIG. 5, but the present disclosure is not limited thereto. The connection pillar 311 may include a conductive material. The connection pillar 311 may include, e.g., tin (Sn), silver (Ag), copper (Cu), tungsten (W), and/or an alloy thereof. The connection pillar 311 may have a first thickness T1 in the third direction DR3.

The connection solder pattern 312 may be provided under a lower surface of the connection pillar 311. The connection solder pattern 312 may be positioned between the connection pillar 311 and the main pad 121. The connection solder pattern 312 may be electrically connected to the connection pillar 311 and the main pad 121.

For example, as illustrated FIG. 3, the connection solder pattern 312 may cover a portion of the main pad 121 protruding from an upper surface 100*a* of the package substrate 100. That is, the connection solder pattern 312 may surround an upper surface and a portion of a side surface of the main pad 121. In this case, a second thickness T2 along the third direction DR3 of the connection solder pattern 312 may be substantially equal to a distance between the upper surface 100*a* of the package substrate 100 and a lower surface of the connection pillar 311. However, the present disclosure is not limited thereto, and as illustrated in FIG. 4, the connection solder pattern 312 may not be positioned on the side surface of the main pad 121. That is, the connection solder pattern 312 may be positioned on the upper surface of the main pad 121. In this case, a second thickness T2 along the third direction DR3 of the connection solder pattern 312 may be smaller than the distance between the upper surface 100*a* of the package substrate 100 and a lower surface of the connection pillar 311.

The connection solder pattern 312 may include a conductive material. The connection solder pattern 312 may include, e.g., tin (Sn), silver (Ag), copper (Cu), manganese (Mn), lead (Pb), and/or an alloy thereof. The connection solder pattern 312 may include, e.g., solder balls and solder bumps.

The dummy insulating pattern 130 may be positioned in the dummy area DA. The dummy insulating pattern 130 may be positioned between the package substrate 100 and the semiconductor chip 200 in the dummy area DA. The dummy insulating pattern 130 may be positioned between the contact areas CA. For example, as illustrated in FIG. 1, the dummy insulating pattern 130 may be positioned between the connection bumps 310 in the first contact area CA1 and the connection bumps 310 in the second contact area CA2 in a plan view. Additionally, the dummy insulating pattern 130 may surround a portion of the contact area CA. For example, the dummy insulating pattern 130 may be positioned to surround the connection bumps 310 in the first contact area CA1, but the present disclosure is not limited thereto.

In some embodiments, the dummy insulating pattern 130 may be positioned to cover an upper surface of the main wiring pattern 122. For example, as illustrated in FIG. 2 and FIG. 3, the dummy insulating pattern 130 may extend in a horizontal direction (e.g., in the first direction DR1 and/or the second direction DR2) to cover the main wiring pattern 122. An upper surface of the dummy insulating pattern 130 may contact a portion of the upper surface 100*a* of the package substrate 100. Accordingly, the dummy insulating pattern 130 may prevent the main wiring pattern 122 from being electrically connected to another conductive material.

In some embodiments, the upper surface of the dummy insulating pattern 130 may be positioned at substantially a same level as an upper surface of the connection solder pattern 312. In other words, the upper surface of the dummy insulating pattern 130 and the upper surface of the connection solder pattern 312 may have substantially a same distance from the upper surface 100*a* of the package substrate 100. Accordingly, as illustrated in FIG. 3, a third thickness T3 of the dummy insulating pattern 130 in the third direction DR3 may be substantially equal to the second thickness T2 of the connection solder pattern 312 in the third direction DR3.

However, the present disclosure is not limited thereto, as illustrated in FIG. 4, the third thickness T3 of the dummy insulating pattern 130 along the third direction DR3 may be greater than the second thickness T2 of the connection solder pattern 312 in the third direction DR3. However, even in this case, the upper surface of the dummy insulating pattern 130 may be positioned at substantially a same level as an upper surface of the connection solder pattern 312.

In some embodiments, a width of the dummy insulating pattern 130 may be greater than a width of each of the dummy pillars 321. The dummy insulating pattern 130 may be positioned in the dummy area DA, and thus the dummy insulating pattern 130 may be arranged to be spaced apart from the main pads 121 and the connection bumps 310. However, the present disclosure is not limited thereto, and the dummy insulating pattern 130 may contact the connection bumps 310. This will be described below with reference to FIG. 7.

The dummy pillars 321 may be positioned in the dummy area DA. The dummy pillars 321 may be provided on a lower surface of the semiconductor chip 200 in the dummy area DA. Accordingly, in the dummy area DA, some of the dummy pillars 321 may overlap the main wiring pattern 122 in the third direction DR3. The dummy pillars 321 may not be positioned on the lower surfaces of the chip pads 240. The dummy pillars 321 may not overlap the chip pads 240 in the third direction DR3.

The dummy pillars 321 may be positioned between the dummy insulating pattern 130 and the semiconductor chip 200. The dummy pillars 321 may be positioned on the dummy insulating pattern 130 in the dummy area DA. The dummy pillars 321 may contact the semiconductor chip 200 and the dummy insulating pattern 130. The dummy pillars 321 may be electrically insulated from the semiconductor chip 200 and the dummy insulating pattern 130. The dummy pillars 321 may completely overlap the dummy insulating pattern 130 in the third direction DR3.

In some embodiments, the dummy pillars 321 may be a structure to improve fluidity of a material forming the underfill film 410 in the dummy area DA. That is, the underfill film 410 may flow through a capillary flow process of the dummy pillars 321. This will be described below with reference to FIG. 6.

In some embodiments, the fourth thickness T4 of the dummy pillars 321 in the third direction DR3 may be substantially equal to the first thickness T1 of the connection pillars 311 in the third direction DR3. This is because the dummy pillars 321 and the connection pillars 311 may be positioned together on the lower surface of the semiconductor chip 200 through a same process.

Accordingly, a sum of the fourth thickness T4 of the dummy pillars 321 along the third direction DR3 and the third thickness T3 of the dummy insulating pattern 130 along the third direction DR3 may be substantially equal to a distance between the lower surface of the semiconductor chip 200 and the package substrate 100. That is, the sum of the fourth thickness T4 of the plurality of dummy pillars 321 along the third direction DR3 and the third thickness T3 of the dummy insulating pattern 130 along the third direction DR3 may be substantially the same as a sum of the first thickness T1 along the third direction DR3 of the connection pillars 311 and the second thickness T2 along the third direction DR3 of the connection solder patterns 312.

However, the present disclosure is not limited thereto, as illustrated in FIG. 4, the sum of the fourth thickness T4 of the dummy pillars 321 along the third direction DR3 and the third thickness T3 of the dummy insulating pattern 130 along the third direction DR3 may be greater than the sum of the first thickness T1 along the third direction DR3 of the connection pillars 311 and the second thickness T2 along the third direction DR3 of the connection solder patterns 312.

The dummy pillars 321 may be arranged to be spaced apart from each other in the dummy area DA. For example, as illustrated in FIG. 5, the dummy pillars 321 may be arranged to be spaced apart along the first diagonal direction DG1 and the second diagonal direction DG2. In this case, the dummy pillars 321 may be arranged to be spaced apart at a predetermined distance along the first diagonal direction DG1 and the second diagonal direction DG2. For example, the dummy pillars 321 that are closest to each other in the first diagonal direction DG1 may be arranged to be spaced apart by a second distance DI2. Herein, the second distance DI2 may be a minimum distance between the dummy pillars 321 adjacent to each other in the first diagonal direction DG1.

In some embodiments, the second distance DI2 between the dummy pillars 321 closest to each other in the first diagonal direction DG1 may be substantially equal to the first distance DI1 between the connection pillars 311 closest to each other in the first diagonal direction DG1. In addition, the second distance DI2 between the plurality of dummy pillars 321 closest to each other in the first diagonal direction DG1 may be substantially equal to the third distance DI3 between the connection pillars 311 and the dummy pillars 321 closest to each other in the first diagonal direction DG1. Accordingly, according to some embodiments, a distance between the dummy pillars 321 and the plurality of connection pillars 311 may be substantially the same. That is, the dummy pillars 321 and the connection pillars 311 may be arranged at substantially equal intervals.

In some embodiments, the second distance DI2 between the dummy pillars 321 closest to each other in the first diagonal direction DG1 may be substantially equal to a distance between the dummy pillars 321 closest to each other in the second diagonal direction DG2, but the present disclosure is not limited thereto.

In addition, in the drawing, the dummy pillars 321 are illustrated as being arranged to be spaced apart along the first diagonal direction DG1 and the second diagonal direction DG2, but the present disclosure is limited thereto, and the dummy pillars 321 may be arranged in the first direction DR1 and/or the second direction DR2. In this case as well, the distance between the dummy pillars 321 closest to each other in the first direction DR1 and/or the second direction DR2 may be substantially equal to the distance between the connection pillars 311 closest to each other in the first direction DR1 and/or the second direction DR2.

In some embodiments, each of the dummy pillars 321 may have a circular cylinder shape. For example, each of the dummy pillars 321 may have a circular shape in a plan view, as illustrated in FIG. 5, but the present disclosure is not limited thereto. In this case, the second diameter D2 of the dummy pillars 321 may be substantially equal to the first diameter D1 of the connection pillars 311.

Accordingly, a ratio of the connection pillars 311 per unit area in the contact area CA may be substantially the same as a ratio of the dummy pillars 321 per unit area in the dummy area DA. Herein, the ratio of the connection pillars 311 per unit area in the contact area CA may indicate a number or sum of the areas of the connection pillars 311 per unit area in the contact area CA. Additionally, the ratio of the dummy pillars 321 per unit area in the dummy area DA may indicate the number or sum of the areas of the dummy pillars 321 per unit area in the dummy area DA. That is, a number of the connection pillars 311 per unit area in the contact area CA may be substantially the same as a number of the dummy pillars 321 per unit area in the dummy area DA. Alternatively, a sum of areas of the connection pillars 311 per unit area in the contact area CA may be substantially the same as a sum of areas of the dummy pillars 321 per unit area in the dummy area DA.

The dummy pillars 321 may include a same material as that of the connection pillars 311. The dummy pillars 321 may include a conductive material. The dummy pillars 321 may include, e.g., tin (Sn), silver (Ag), copper (Cu), tungsten (W), and/or an alloy thereof.

Referring again to FIG. 2 and FIG. 3, the underfill film 410 may be provided in a gap area between the package substrate 100 and the semiconductor chip 200. The underfill film 410 may be disposed on and around the connection bumps 310 and the dummy pillars 321. The underfill film 410 may encapsulate the connection bumps 310, the dummy insulating pattern 130, and the dummy pillars 321. Additionally, the underfill film 410 may extend along at least a portion of a sidewall of the semiconductor chip 200, but the present disclosure is not limited thereto.

In some embodiments, the underfill film 410 may include a material with flowability or fluidity. For example, the underfill film 410 may include an insulating polymer such as an epoxy polymer. The underfill film 410 may be formed by a capillary flow process after the semiconductor chip 200 is mounted on the package substrate 100.

The molding film 400 may be positioned on an upper surface of the semiconductor chip 200 and an upper surface of the package substrate 100. The molding film 400 may cover the semiconductor chip 200. The molding film 400 may include an insulating polymer such as an epoxy-based molding compound.

However, the present disclosure is not limited thereto, and the molding film 400 may be further extended between the package substrate 100 and the semiconductor chip 200. This will be described below with reference to FIG. 8.

Hereinafter, with further reference to FIG. 6, a process of forming an underfill film of a semiconductor package according to some embodiments will be described.

Figure 6:
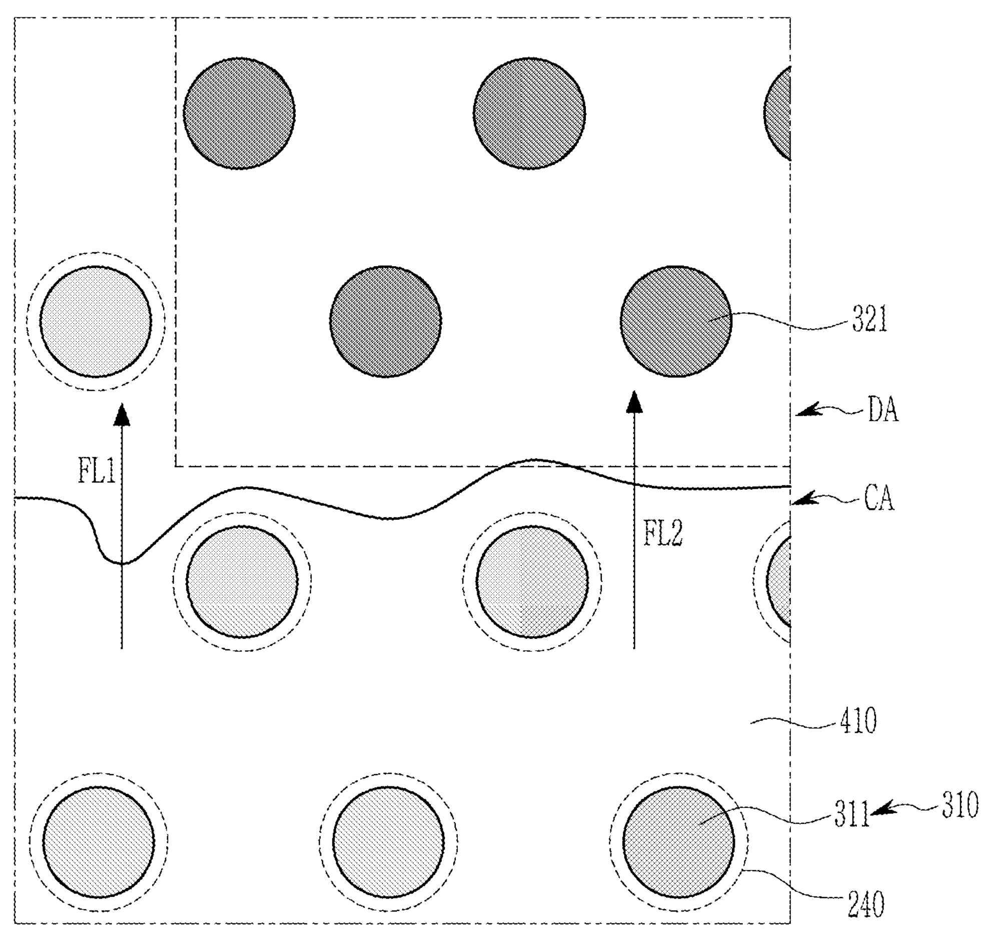
Figure 6:
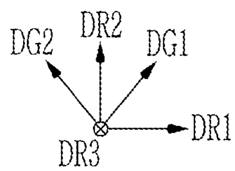

FIG. 6 illustrates a top plan view showing a partial area of a semiconductor package according to some embodiments. FIG. 6 illustrates a process of forming the underfill film 410 between the package substrate 100 and the semiconductor chip 200.

Referring further to FIG. 6, as described above, the underfill film 410 may be formed between the package substrate 100 and the semiconductor chip 200. For example, the underfill film 410 may be filled between the package substrate 100 and the semiconductor chip 200 along a direction (e.g., the second direction DR2). The underfill film 410 may include a material with flowability, and may fill a space between the package substrate 100 and the semiconductor chip 200 while flowing in a direction (e.g., the second direction DR2). Accordingly, the underfill film 410 may encapsulate the connection bumps 310 and the dummy pillars 321.

In this case, the flowability of the underfill film 410 may be determined by a material forming the underfill film 410, a temperature of the underfill film 410, and a thickness and a width of a space through which the underfill film 410 flows. Particularly, if the underfill film 410 is formed by a capillary flow process between the connection bumps 310 and the dummy pillars 321, the fluidity of the underfill film 410 may depend on the distance between the connection bumps 310 and the dummy pillars 321. For example, in some embodiments, as the distance between the connection bumps 310 and the dummy pillars 321 becomes smaller, the fluidity of the underfill film 410 may increase due to the capillary flow process. Herein, the flowability of the underfill film 410 may indicate a flow rate of the underfill film 410 flowing in a direction (e.g., the second direction DR2).

The semiconductor package 10 according to some embodiments includes a plurality of dummy pillars 321 in the dummy area DA, thereby improving the fluidity of the underfill film 410 in the dummy area DA. In addition, the second distance DI2 between the dummy pillars 321 closest to each other in the first diagonal direction DG1 may be substantially equal to the first distance DI1 between the connection pillars 311 closest to each other in the first diagonal direction DG1. Accordingly, if the underfill film 410 flows in one direction (e.g., the second direction DR2), flowability FL2 of the underfill film 410 between the dummy pillars 321 and the flowability FL1 of the underfill film 410 between the connection pillars 311 may be substantially the same. Accordingly, the underfill film 410 may be formed between the dummy pillars 321 and the connection pillars 311 at a same speed, and the underfill film 410 may be uniformly formed between the package substrate 100 and the semiconductor chip 200. Accordingly, reliability of the semiconductor package 10 may be improved.

In addition, according to some embodiments, in the semiconductor package 10, the ratio of the connection pillars 311 per unit area in the contact area CA and the ratio of the dummy pillars 321 per unit area in the dummy area DA may be substantially the same. Accordingly, the underfill film 410 may have uniform flowability in the contact area CA and the dummy area DA, and it is possible to prevent pores from being created by a difference in speeds at which the underfill film 410 is formed. Accordingly, reliability of the semiconductor package 10 may be improved.

Hereinafter, the semiconductor package 10 according to some embodiments will be described with reference to FIG. 7 to FIG. 10.

Figure 7:
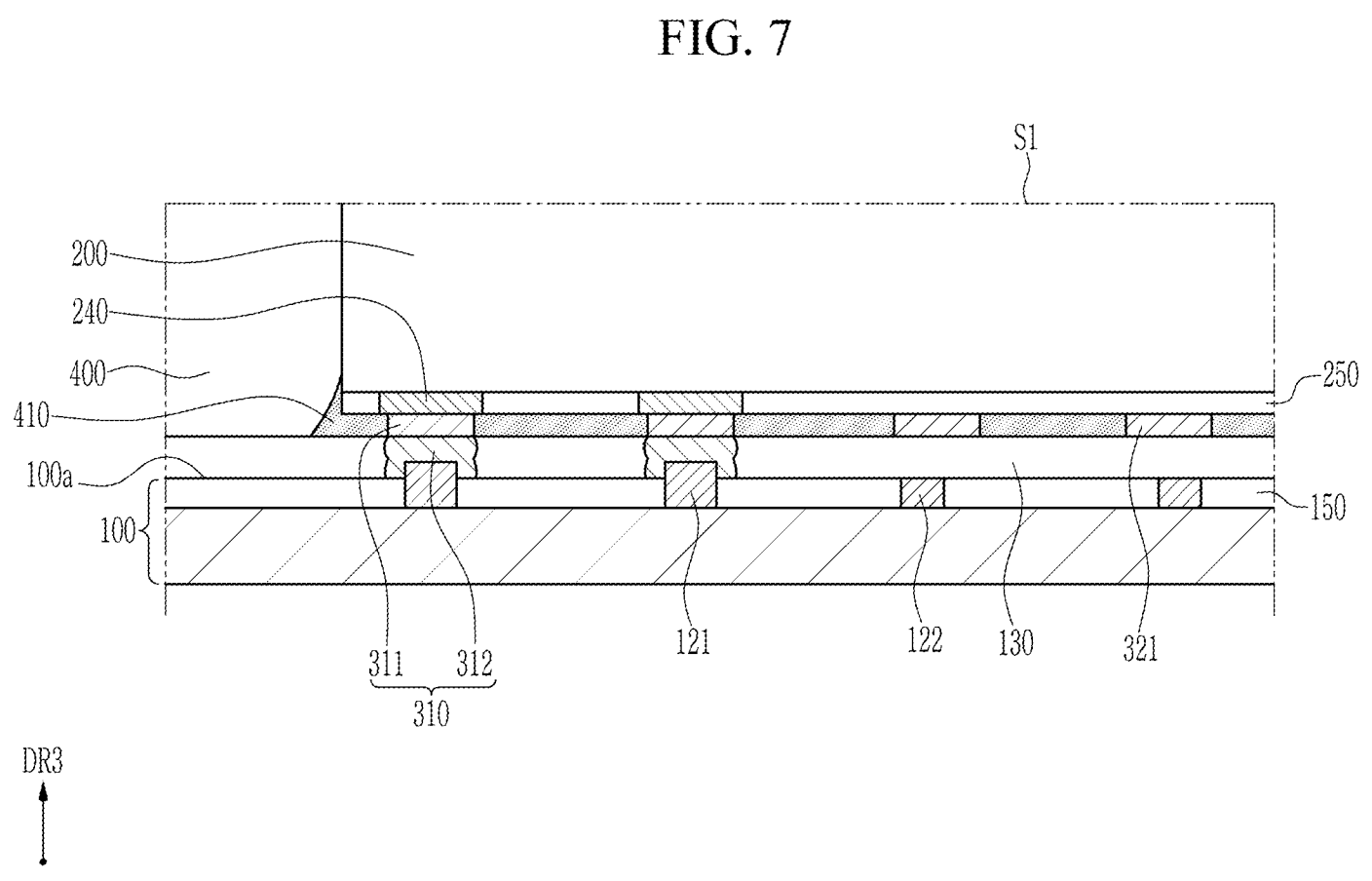

FIG. 7 illustrate a cross-sectional view showing a semiconductor package according to some embodiments.

Since the embodiment illustrated in FIG. 7 is equivalent to the embodiment illustrated in FIG. 1 to FIG. 6, a description thereof will be omitted and differences therebetween will be mainly described in the interest of brevity. In FIG. 7, a shape of the dummy insulating pattern 130 is different from that of FIGS. 1-6, and will be described below.

The semiconductor package 10 according to some embodiments may include a package substrate 100, a semiconductor chip 200, a plurality of connection bumps 310, a dummy insulating pattern 130, and a plurality of dummy pillars 321.

In the previous embodiments, the dummy insulating pattern 130 may be positioned in the dummy area DA. The dummy insulating pattern 130 may be positioned between the contact areas CA. The dummy insulating pattern 130 may also be arranged to be spaced apart from the main pads 121 and the connection bumps 310.

Referring to FIG. 7, the dummy insulating pattern 130 according to some embodiments may be positioned in the dummy area DA and the contact area CA.

The dummy insulating pattern 130 may be positioned between the package substrate 100 and the semiconductor chip 200 in the dummy area DA and the contact area CA. The dummy insulating pattern 130 may be positioned between the main pads 121, between the main pads 121 and the main wiring pattern 122, and between the main wiring patterns 122 in a plan view. The dummy insulating pattern 130 may extend between the connection bumps 310 and between the main pads 121 and the main wiring pattern 122. The dummy insulating pattern 130 may not cover the main pads 121. That is, the dummy insulating pattern 130 may not overlap the main pads 121 in the third direction DR3.

In some embodiments, the dummy insulating pattern 130 may directly contact the main pads 121 and the connection bumps 310. For example, the dummy insulating pattern 130 may directly contact side surfaces of the main pads 121. Additionally, the dummy insulating pattern 130 may directly contact the connection solder patterns 312. In this case, an upper surface of the dummy insulating pattern 130 may be positioned at substantially a same level as that of lower surfaces of the connection pillars 311.

In some embodiments, the underfill film 410 may be positioned on the dummy insulating pattern 130. That is, the underfill film 410 may be provided between the dummy insulating pattern 130 and the semiconductor chip 200.

Figure 8:
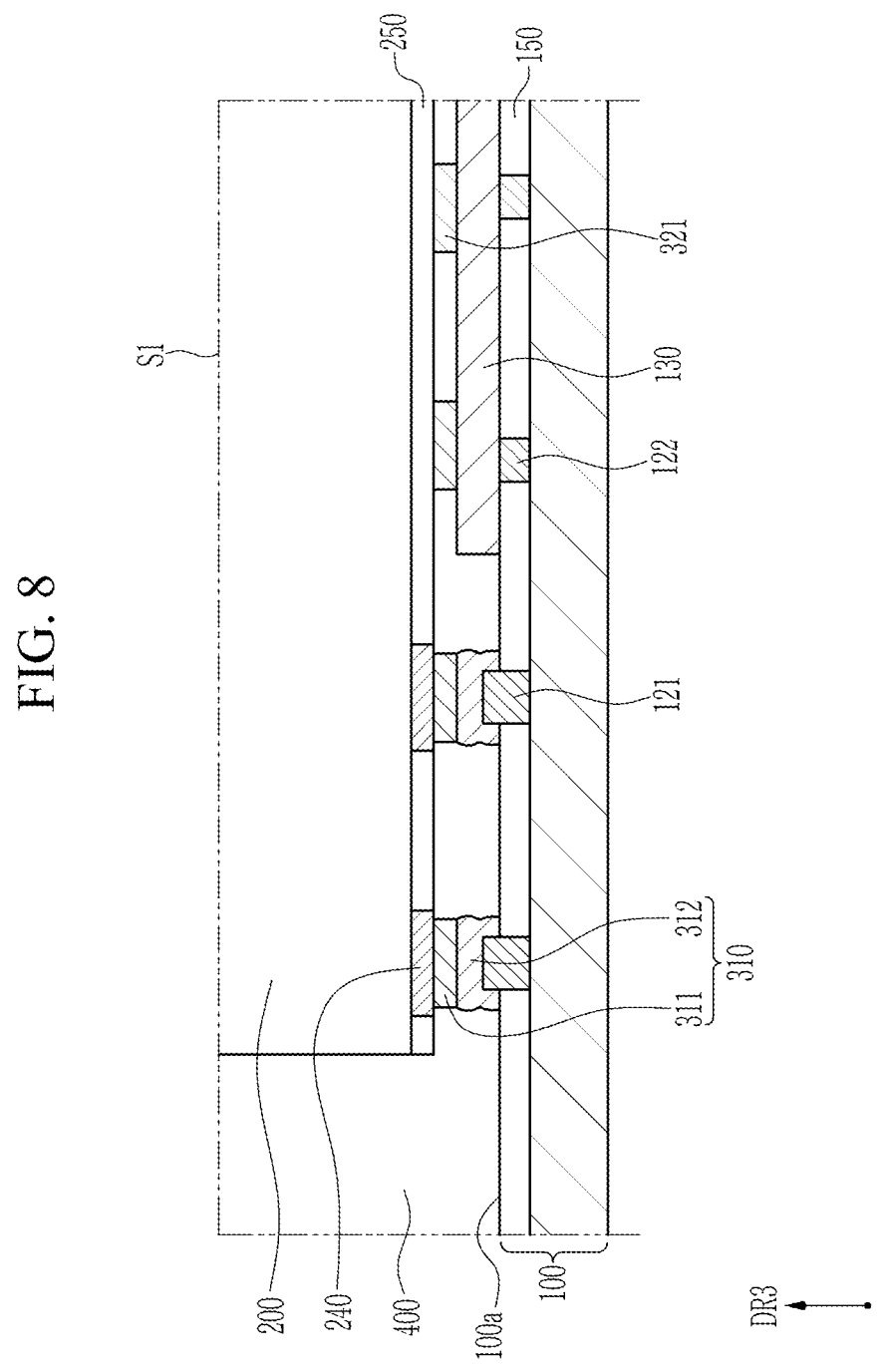

FIG. 8 illustrate a cross-sectional view showing a semiconductor package according to some embodiments.

Since the embodiment illustrated in FIG. 8 is equivalent to the embodiment illustrated in FIG. 1 to FIG. 6, a description thereof will be omitted and differences therebetween will be mainly described in the interest of brevity. FIG. 8 is different from FIGS. 1-6 in that the underfill film 410 is not provided, and will be described below.

The semiconductor package 10 according to some embodiments may include a package substrate 100, a semiconductor chip 200, a plurality of connection bumps 310, a dummy insulating pattern 130, and a plurality of dummy pillars 321.

In the previous embodiments, an underfill film may be positioned between the package substrate 100 and the semiconductor chip 200.

Referring to FIG. 8, the semiconductor package 10 according to some embodiments may not be provided with an underfill film. That is, the underfill film may be omitted, and the molding film 400 may be provided between the package substrate 100 and the semiconductor chip 200.

In some embodiments, the molding film 400 may extend further between the package substrate 100 and the semiconductor chip 200. The molding film 400 may be formed around the connection bumps 310 and the dummy pillars 321. The molding film 400 may encapsulate the connection bumps 310, the dummy insulating pattern 130, and the dummy pillars 321. Additionally, the molding film 400 may extend along a sidewall of the semiconductor chip 200 to cover the semiconductor chip 200.

In this case, the molding film 400, like the underfill film 410 in the embodiments of FIGS. 1 to 6, may be formed by a capillary flow process after being mounted on the package substrate 100. The molding film 400 may include a material with flowability, and may fill a space between the package substrate 100 and the semiconductor chip 200 by a capillary flow process of the connection bumps 310 and the dummy pillars 321.

Even in a case of the semiconductor package 10 according to some embodiments, flowability of the molding film 400 in the dummy area DA may be improved by including the dummy pillars 321 in the dummy area DA. In addition, the molding film 400 may have uniform flowability in the contact area CA and the dummy area DA, and it is possible to prevent pores from being created by a difference in speeds at which the molding film 400 is formed. Accordingly, reliability of the semiconductor package 10 may be improved.

Hereinafter, a manufacturing method for the semiconductor package 10 according to some embodiments will be described with reference to FIG. 9 to FIG. 15.

FIG. 9 to FIG. 15 illustrate cross-sectional views showing an intermediate step in a manufacturing method for a semiconductor package according to some embodiments.

Figure 9:
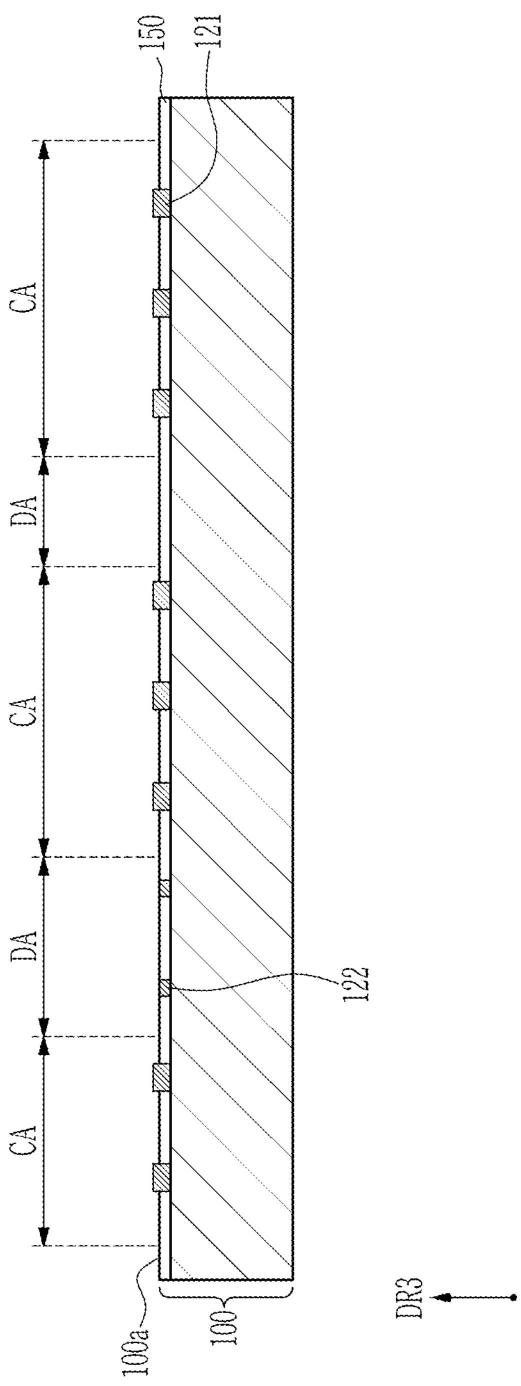

Referring to FIG. 9, the package substrate 100 is prepared. The package substrate 100 may be a substrate for package, e.g., a printed circuit board (PCB) or a ceramic substrate. If the package substrate 100 is a printed circuit board, the package substrate 100 may be made of at least one material selected from phenol resin, epoxy resin, and polyimide.

The main wiring pattern 122 and the main pads 121 may be positioned on the package substrate 100. Specifically, the main wiring pattern 122 may be positioned in the dummy area DA of the package substrate 100, and the main pads 121 may be positioned in the contact area CA of the package substrate 100. The main wiring pattern 122 and the main pads 121 may be formed through the main pad insulating layer 150. The main wiring pattern 122 and the main pads 121 may include a conductive material. For example, the main wiring pattern 122 and the main pads 121 may include at least one of copper (Cu), nickel (Ni), chromium (Cr), aluminum (Al), silver (Ag), gold (Au), or iron (Fe).

Figure 10:
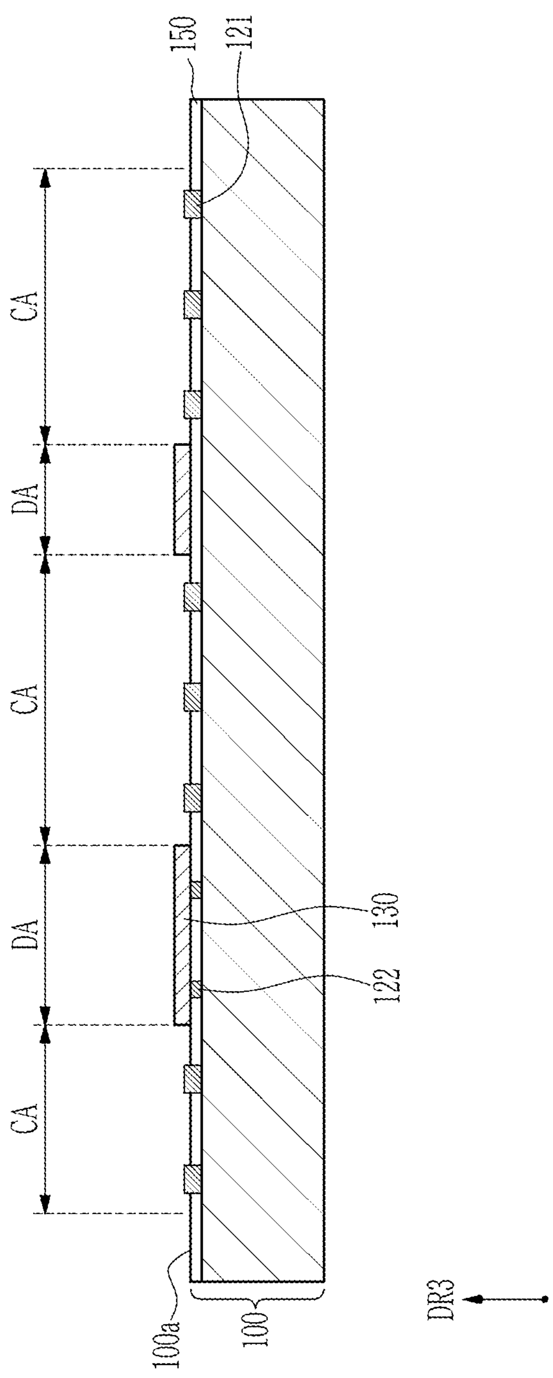

Referring to FIG. 10, a dummy insulating pattern 130 may be positioned on the dummy area DA of the package substrate 100. In the dummy area DA, a dummy insulating pattern 130 may be positioned on the upper surface 100*a* of the package substrate 100. Accordingly, the dummy insulating pattern 130 may cover the main wiring pattern 122. Accordingly, the dummy insulating pattern 130 may prevent the main wiring pattern 122 from being electrically connected to another conductive material.

Figure 11:
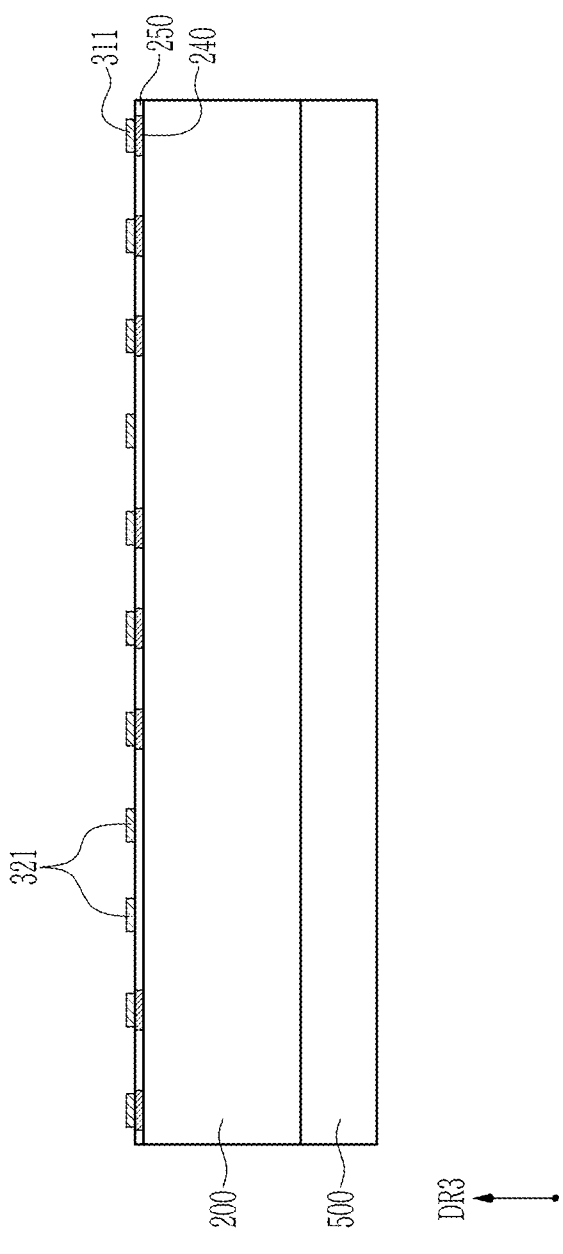

Referring to FIG. 11, the semiconductor chip 200 may be prepared on a carrier substrate 500, and the connection pillars 311 and the dummy pillars 321 may be positioned on the semiconductor chip 200.

The semiconductor chip 200 may include a three-dimensional integrated circuit (3D IC) structure. Additionally, in some embodiments, the semiconductor chip 200 may include a system on chip (SOC). For example, the semiconductor chip 200 may include at least one of a central processing unit (CPU), a graphics processing unit (GPU), a memory, a controller, a codec, a sensor, a communication chip, or any combination thereof. However, the present disclosure is not limited thereto, and the semiconductor chip 200 may include a single chip such as a DRAM or multiple chips such as a high bandwidth memory (HBM).

In some embodiments, the semiconductor chip 200 of the semiconductor package 10 may include the chip pad insulating layer 250 and the chip pads 240. A description of the chip pad insulating layer 250 and the chip pads 240 is substantially the same as that of the embodiment of FIG. 1 to FIG. 6, and thus it will be omitted in the interest of brevity.

The connection pillars 311 and the dummy pillars 321 may be positioned on the semiconductor chip 200. Specifically, the connection pillars 311 may be positioned on the chip pads 240 of the semiconductor chip 200. That is, the connection pillars 311 may overlap the chip pads 240 in the third direction DR3. The connection pillars 311 may be formed at positions corresponding to the main pads 121 of the package substrate 100. Additionally, the dummy pillars 321 may be formed to be spaced apart from the connection pillars 311. Herein, an area where the connection pillars 311 are formed may correspond to the contact area CA of the package substrate 100. An area where the dummy pillars 321 are formed may correspond to the dummy area DA of the package substrate 100.

In this case, a distance between the closest connection pillars 311 and a distance between the closest dummy pillars 321 may be formed to be substantially equal.

In some embodiments, the connection pillars 311 and the dummy pillars 321 may be formed to have substantially a same thickness. The connection pillars 311 may include a same material as that of the dummy pillars 321. The connection pillars 311 and the dummy pillars 321 may include a conductive material. The connecting pillars 311 and the dummy pillars 321 may include, e.g., tin (Sn), silver (Ag), copper (Cu), tungsten (W), and/or an alloy thereof.

Figure 12:
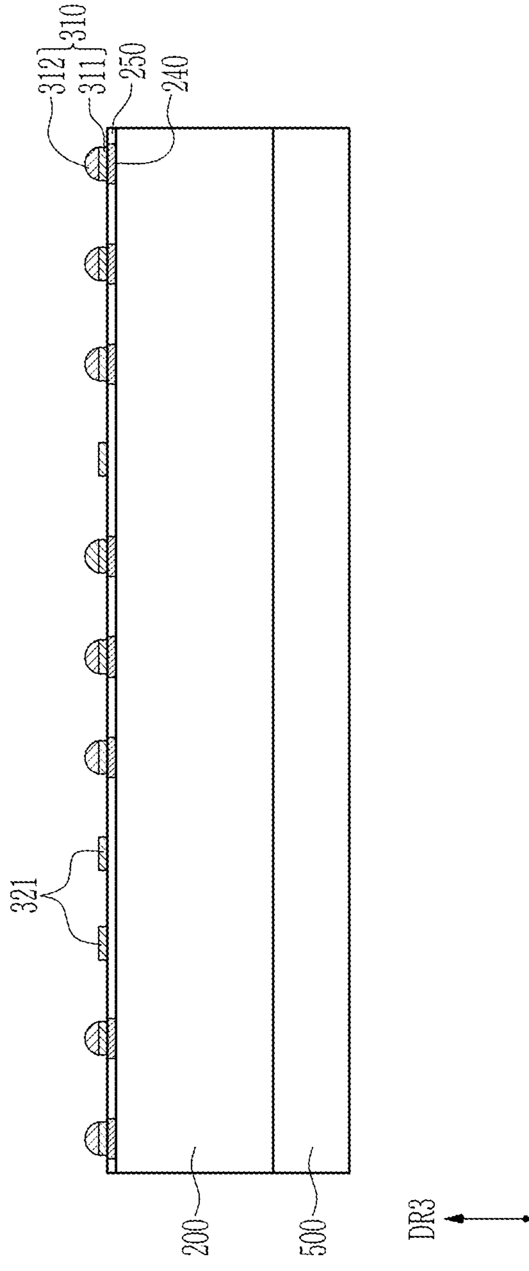

Referring to FIG. 12, the connection solder pattern 312 may be positioned on the connection pillars 311. The connection solder patterns 312 may include a conductive material. The connection solder patterns 312 may include, e.g., tin (Sn), silver (Ag), copper (Cu), manganese (Mn), lead (Pb), and/or an alloy thereof. In this case, the connection solder patterns 312 may not be positioned on the dummy pillars 321.

Figure 13:
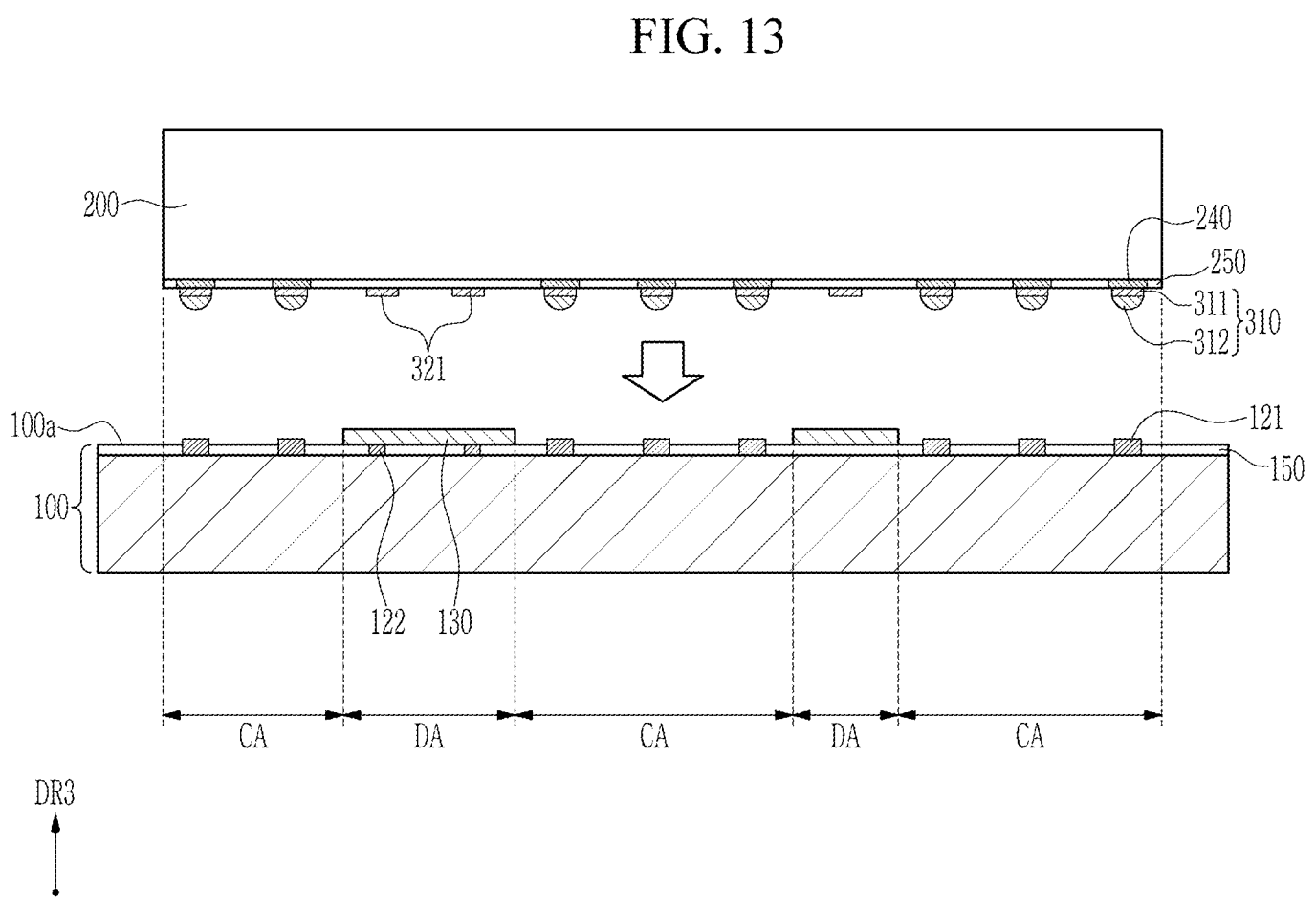

Referring to FIG. 13, the semiconductor chip 200 and the package substrate 100 may be bonded. Specifically, the connection solder patterns 312 of the semiconductor chip 200 and the main pads 121 may be respectively bonded. The connection solder patterns 312 may overlap the main pads 121 in the third direction DR3. Accordingly, the semiconductor chip 200 may be electrically connected to the package substrate 100. In this case, a thickness along the third direction DR3 of the connection solder pattern 312 may be substantially equal to a distance between the upper surface 100*a* of the package substrate 100 and a lower surface of the connection pillar 311.

In this case, the dummy insulating pattern 130 and the dummy pillars 321 may be in direct contact. This is because a thickness of the dummy insulating pattern 130 along the third direction DR3 is substantially the same as a thickness of the connection solder pattern 312 along the third direction DR3. Accordingly, a sum of the thickness of the connection solder pattern 312 along the third direction DR3 and the thickness of the connection pillars 311 along the third direction DR3 may be substantially equal to a sum of the thickness of the dummy pillars 321 along the third direction DR3 and the thickness of the dummy insulating pattern 130 along the third direction DR3.

In some embodiments, the dummy insulating pattern 130 and the dummy pillars 321 may be electrically insulated.

Figure 14:
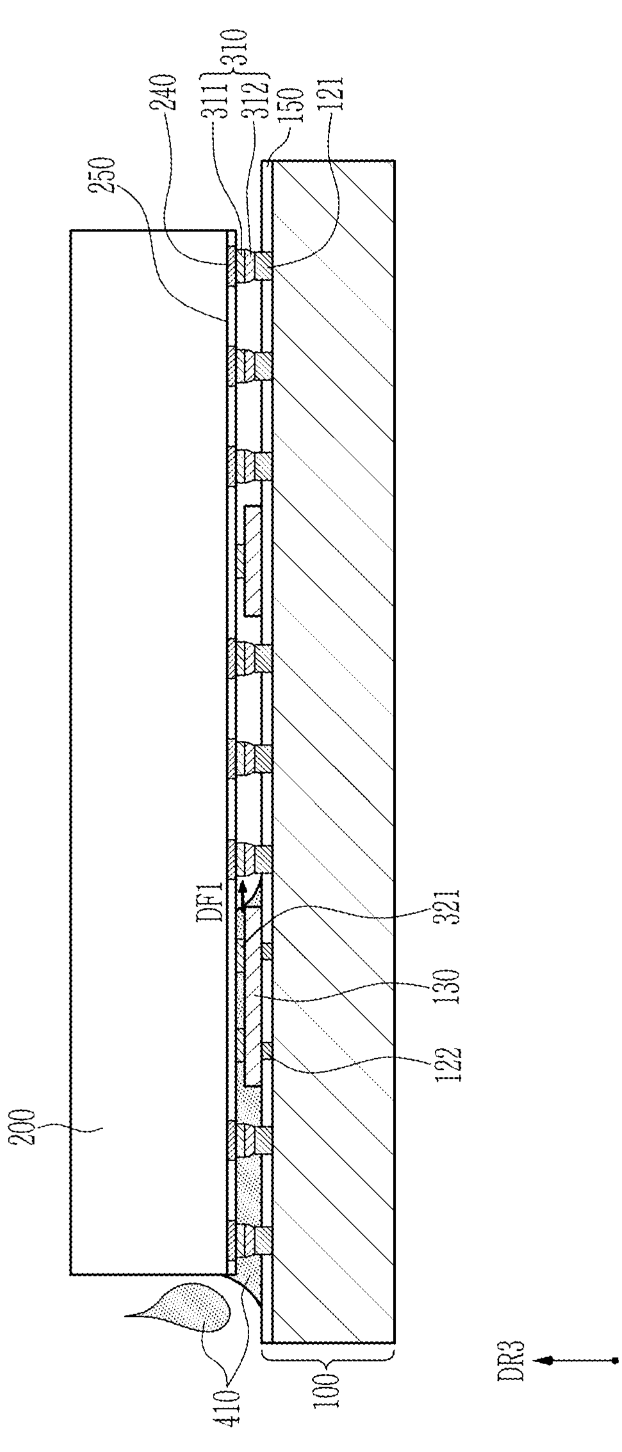

Referring to FIG. 14, the underfill film 410 may be formed in a space between the semiconductor chip 200 and the package substrate 100.

For example, the underfill film 410 may be filled or received between the package substrate 100 and the semiconductor chip 200 along a first flow direction DF1 from a first side of the semiconductor chip 200. The underfill film 410 may include a material with flowability, and may fill a space between the package substrate 100 and the semiconductor chip 200 while flowing in the first flow direction DF1. Accordingly, the underfill film 410 may encapsulate the connection bumps 310 and the dummy pillars 321.

In some embodiments, flowability of the underfill film or layer 410 in the dummy area DA may be improved by including the dummy pillars 321 between the package substrate 100 and the semiconductor chip 200. Additionally, in some embodiments, a distance between the closest dummy pillars 321 and a distance between the closest connection pillars 311 may be substantially the same. Accordingly, flowability of the underfill film 410 between the dummy pillars 321 and flowability of the underfill film 410 between the connection pillars 311 may be substantially the same. Accordingly, the underfill film 410 may be formed between the dummy pillars 321 and the connection pillars 311 at a same speed, and the underfill film 410 may be uniformly formed between the package substrate 100 and the semiconductor chip 200.

Figure 15:
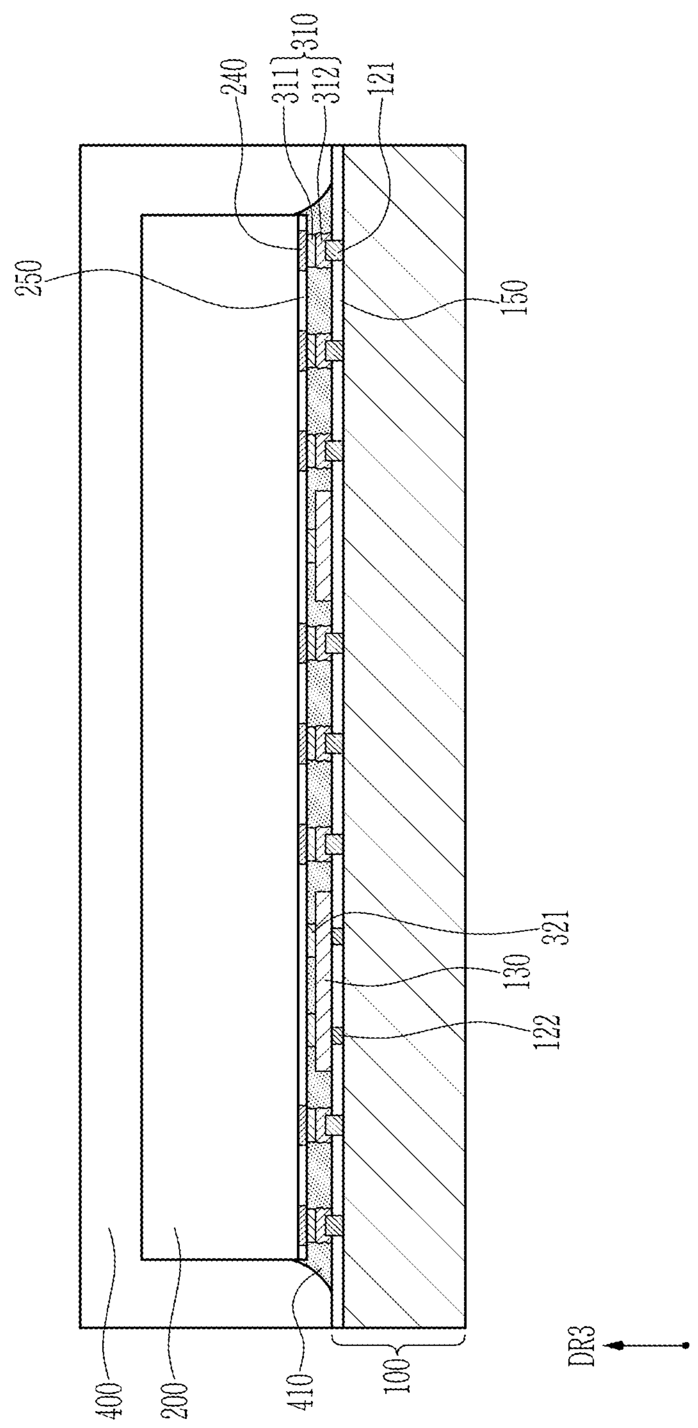

Referring to FIG. 15, the molding film 400 may be formed to cover the semiconductor chip 200. In some embodiments, a molding process using the molding film 400 may include a compression molding or transfer molding process. A process of forming the molding film 400 may include a process of forming a molding material to cover the semiconductor chip 200 and then planarizing an upper surface of the molding film 400 by performing chemical mechanical polishing (CMP). Accordingly, the semiconductor package 10 according to some embodiments may be formed.

The semiconductor package 10 according to some embodiments includes a plurality of dummy pillars 321 in the dummy area DA, thereby improving the fluidity of the underfill film 410 in the dummy area DA.

Additionally, in some embodiments, a distance between the closest dummy pillars 321 and a distance between the closest connection pillars 311 may be substantially the same. Accordingly, if the underfill film 410 flows in a direction, flowability of the underfill film 410 between the dummy pillars 321 and flowability of the underfill film 410 between the connection pillars 311 may be substantially the same. Accordingly, the underfill film 410 may be formed between the dummy pillars 321 and the connection pillars 311 at a same speed, and the underfill film 410 may be uniformly formed between the package substrate 100 and the semiconductor chip 200. Accordingly, it is possible to prevent pores created by a difference in a speed at which the underfill film 410 is formed, and to improve reliability of the semiconductor package 10.

While the present disclosure has been described in connection with what is presently considered to be practical embodiments, it is to be understood that the disclosure is not limited to the disclosed embodiments, but, on the contrary, is intended to cover various modifications and equivalent arrangements included within the spirit and scope of the appended claims.

What is claimed is:

1. A semiconductor package comprising:
a package substrate including a main pad and a main wiring pattern;
a semiconductor chip on the package substrate;
a plurality of connection bumps between the package substrate and the semiconductor chip and including a plurality of connection solder patterns on the main pad and a plurality of connection pillars on the connection solder patterns;
a dummy insulating pattern between the package substrate and the semiconductor chip and configured to cover the main wiring pattern; and
a plurality of dummy pillars on the dummy insulating pattern,
wherein the dummy pillars are in contact with the dummy insulating pattern, and are electrically insulated from the dummy insulating pattern.

2. The semiconductor package of claim 1, wherein
a thickness of the dummy pillars is the same as a thickness of the connection pillars.

3. The semiconductor package of claim 2, wherein
a sum of the thickness of the dummy pillars and a thickness of the dummy insulating pattern is equal to a thickness of the connection bumps.

4. The semiconductor package of claim 1, wherein
the main pad extends from an upper surface of the package substrate, and
an upper surface of the main wiring pattern is coplanar with the upper surface of the package substrate.

5. The semiconductor package of claim 1, wherein
a distance between the dummy pillars closest to each other is equal to a distance between the connection pillars closest to each other.

6. The semiconductor package of claim 4, wherein
a diameter of the dummy pillars is the same as a diameter of the connection pillars.

7. The semiconductor package of claim 1, wherein
the dummy insulating pattern does not vertically overlap the main pad.

8. The semiconductor package of claim 7, wherein
a width of the dummy insulating pattern is greater than a width of the dummy pillars.

9. The semiconductor package of claim 7, wherein
the dummy insulating pattern is in contact with the connection solder patterns.

10. The semiconductor package of claim 1, wherein
the main wiring pattern vertically overlaps a portion of the dummy pillars.

11. The semiconductor package of claim 1, wherein
the dummy pillars and the connection pillars include a same material.

12. The semiconductor package of claim 1, further comprising
a chip pad at a lower surface of the semiconductor chip that is physically and electrically connected to the connection pillars,
wherein the chip pad does not vertically overlap the dummy pillars.

13. A semiconductor package comprising:
a package substrate;
a semiconductor chip on the package substrate;
a plurality of connection bumps between the package substrate and the semiconductor chip, each including a connection solder pattern and a connection pillar on the connection solder pattern;
a dummy insulating pattern between the package substrate and the semiconductor chip and positioned between the connection bumps; and
a plurality of dummy pillars on the dummy insulating pattern,
wherein the dummy pillars are in contact with the dummy insulating pattern, and are electrically insulated from the dummy insulating pattern.

14. The semiconductor package of claim 13, wherein
a thickness of the dummy pillars is the same as a thickness of the connection pillar, and a thickness of the dummy insulating pattern is the same as a thickness of the connection solder pattern.

15. A semiconductor package comprising:
a package substrate including a main pad and a main wiring pattern;
a semiconductor chip on the package substrate and including a chip pad;
a plurality of connection bumps between the package substrate and the semiconductor chip;
a dummy insulating pattern between the package substrate and the semiconductor chip and configured to cover the main wiring pattern; and a plurality of dummy pillars on the dummy insulating pattern, wherein the plurality of connection bumps include:

a plurality of connection solder patterns on the main pad; and a plurality of connection pillars on the connection solder patterns and connected to the chip pad, and a thickness of the dummy pillars is the same as a thickness of the connection pillars.

16. The semiconductor package of claim 15, wherein the dummy insulating pattern is between the connection bumps.

17. The semiconductor package of claim 16, wherein the dummy pillars vertically overlap the dummy insulating pattern.

18. The semiconductor package of claim 15, wherein each of the dummy pillars is in contact with the dummy insulating pattern, and is electrically insulated from the dummy insulating pattern.

19. The semiconductor package of claim 15, wherein a distance between the dummy pillars closest to each other is equal to a distance between the connection pillars closest to each other.

20. The semiconductor package of claim 19, wherein a distance between the dummy pillars closest to each other is equal to a distance between the connection pillars closest to the dummy pillars.

* * * * *